United States Patent [19]
Kibrick

[11] Patent Number: 4,901,073
[45] Date of Patent: * Feb. 13, 1990

[54] ENCODER FOR MEASURING THE ABSOLUTE POSITION OF MOVING ELEMENTS

[75] Inventor: Robert I. Kibrick, Santa Cruz, Calif.

[73] Assignee: Regent of the University of California, Alameda, Calif.

[*] Notice: The portion of the term of this patent subsequent to Apr. 5, 2005 has been disclaimed.

[21] Appl. No.: 176,109

[22] Filed: Mar. 30, 1988

Related U.S. Application Data

[63] Continuation-in-part of Ser. No. 938,164, Dec. 4, 1986, Pat. No. 4,736,187.

[51] Int. Cl.⁴ .............................................. H03M 1/22
[52] U.S. Cl. .......................................... 341/13; 341/3
[58] Field of Search .................... 341/13; 250/231 SE, 250/237 G; 235/462

[56] References Cited

U.S. PATENT DOCUMENTS

| | | | |
|---|---|---|---|
| 4,074,258 | 2/1978 | Doré et al. | 341/13 |
| 4,631,519 | 12/1986 | Johnston | 341/13 |
| 4,633,224 | 12/1986 | Gipp et al. | 341/13 |
| 4,720,699 | 1/1988 | Smith | 341/13 |
| 4,736,187 | 4/1988 | Kilbrick et al. | 341/13 |

*Primary Examiner*—William M. Shoop, Jr.
*Assistant Examiner*—Marc S. Hoff
*Attorney, Agent, or Firm*—Owen, Wickersham & Erickson

[57] ABSTRACT

An optical encoding system for determining the absolute position of a movable member relative to a stationary member. For example, a bar-code scanner may be supported by a stationary member for scanning bar-code symbols in its field of view. An encoding band may be supported by the movable member so that a portion of the band is scanned by the bar-code scanner. Affixed to or otherwise marked on the band is a sequential series of bar-code symbols, each symbol encoding the absolute position of its location on the band. A bar-code decoding system, actuated by the signals produced by the bar-code scanner, decodes the bar-code symbol scanned by the scanner, and determines the absolute position of a movable member relative to the stationary member.

14 Claims, 8 Drawing Sheets

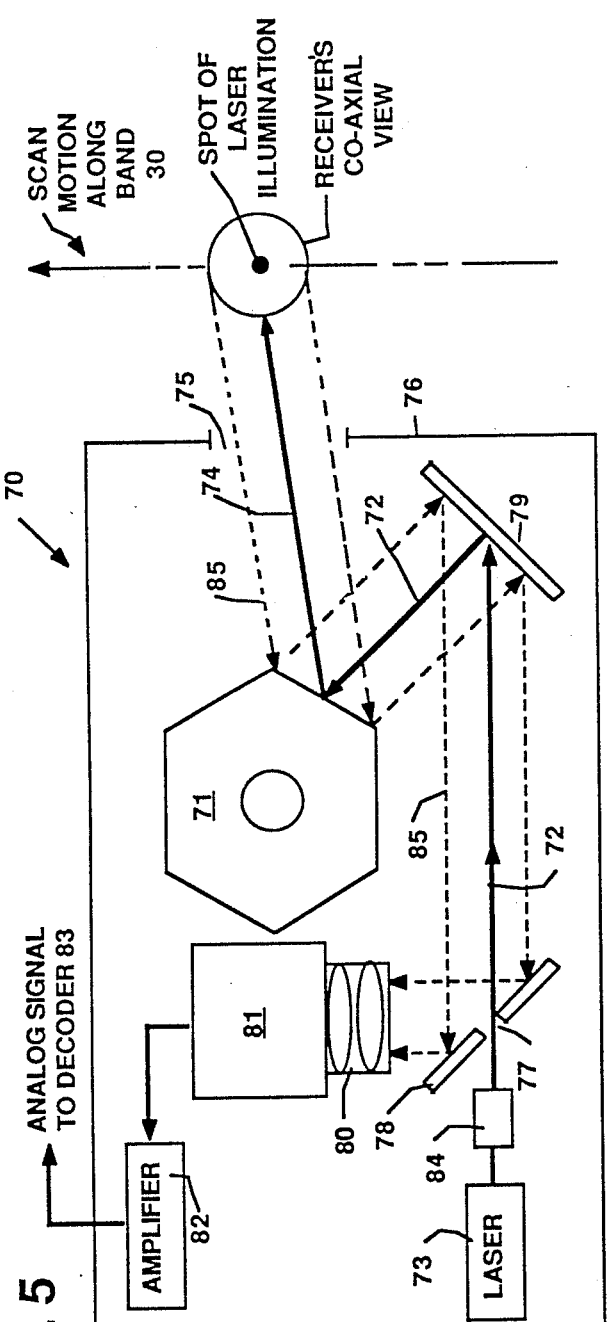
FIG. 5
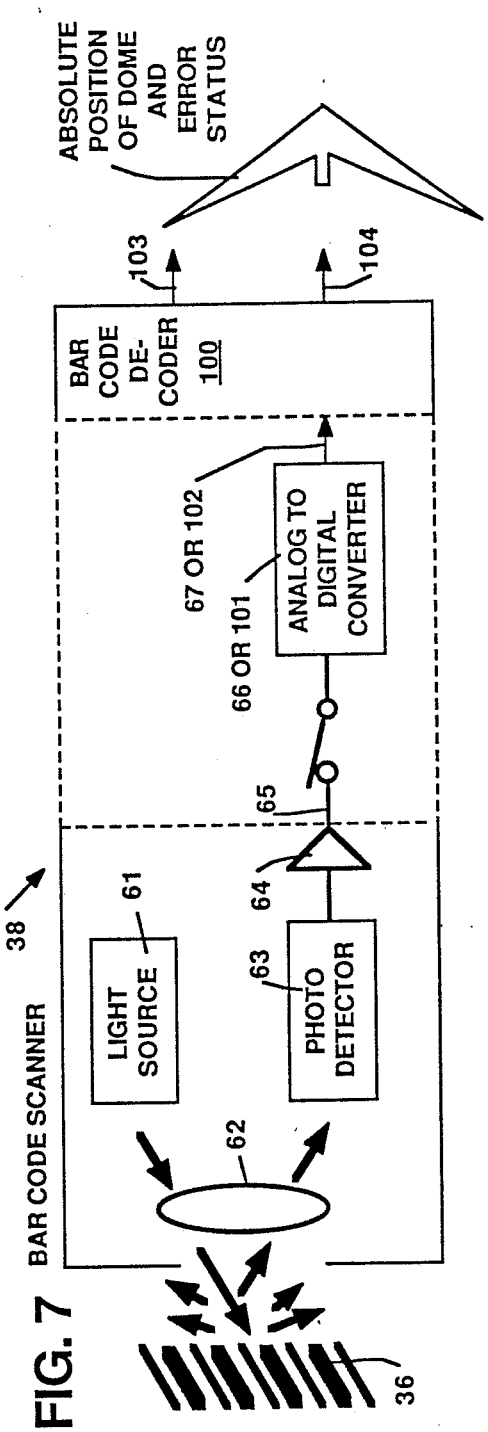
FIG. 7 BAR CODE SCANNER 38

USS-I 2/5

USS-CODABAR

USS - 39

USS - 128

ENCODER FOR MEASURING THE ABSOLUTE POSITION OF MOVING ELEMENTS

CROSS-REFERENCE TO RELATED APPLICATION

This application is a continuation-in-part of application Ser. No. 938,164, filed Dec. 4, 1986, now U.S. Pat. No. 4,736,187 issued Apr. 5, 1988.

FIELD OF THE INVENTION

This invention relates to an encoder utilizing barcode symbols scanned by moving beam or area-detector barcode scanners to encode and measure the absolute angular or linear position of moving elements, including rotating members.

The encoder of this invention is especially suitable for measuring the azimuthal position of telescope domes. It provides a relatively inexpensive and highly reliable system for measuring dome position, which has few moving parts and which eliminates the need for a mechanical engagement to the telescope dome. It may also be used to measure accurately the angular or linear position of comparably sized moving or rotating objects, such as hangar doors, conveyor belts, and elevators.

Since telescope domes provide an excellent example of how this invention may be used, the application of the invention to such apparatus will be used as the prime demonstrative example in this application, but without limiting the invention to the prime example.

BACKGROUND OF THE INVENTION

A number of techniques have been used to measure the position of large rotating objects such as telescope domes. The most common approach has been a mechanical coupling between a conventional rotary position encoder and the moving surface. Thus, telescope dome position has traditionally been encoded by mechanically coupling a rotary encoder to the edge of the dome.

For example, a pinch roller has been pressed against an inner circumference of the dome, to rotate as the dome revolved However, if this pinch roller slipped, large errors in position measurement resulted. An alternative approach to the problem has been to attach a chain to the inner circumference of the dome, the chain then driving a sprocket In either case, the rotating axle of the pinch roller or the sprocket has been used to turn the shaft of a conventional rotary position encoder.

Both incremental and absolute position encoders have been used. When an absolute position encoder was used, a custom-made gear reduction was usually required, so that one rotation of the dome would produce one rotation of the absolute position encoder. Such a custom gear reduction often proved to be more expensive than the absolute position encoder itself. It also tended to introduce errors in position measurement, due to mechanical backlash, and to inexact gearing. When the gear reduction was not exact, the encoder incurred a small incremental error on each rotation; then when the dome was rotated repeatedly in the same direction, this error would accumulate and grow unacceptably large.

While these mechanical couplings sometimes worked well for many years, they could become and eventually became unreliable, especially after decades of mechanical wear. Older domes that shook, wobbled, and nutated as they revolved caused these parts to wear out even faster. For example, the 100-year-old dome on the 1-meter Nickel Telescope and the 30-year-old dome on the 3-meter Shane Telescope, both at Lick Observatory, have suffered from unreliable dome pointing, caused by worn mechanical couplings between the position encoder and the dome.

If an incremental position encoder is used, then some other mechanism is required to establish an initial absolute position. This has often been accomplished by a switch which was tripped whenever the dome was rotated to an index or reference position. However, for a large dome, it can take a considerable period of time to rotate the dome to its initializing position.

In either case, while one can easily obtain conventional position encoders (either absolute or incremental) that are by themselves relatively accurate, reliable, and inexpensive, the accuracy, reliability, and economy of the position measurement that is ultimately achieved is often compromised by the inaccuracy, unreliability, and expense of the mechanical coupling between the encoder and the dome.

Even if an inexpensive and reliable mechanical coupling could be found, currently available rotary encoders do not utilize internal redundancy in their encoding of position. These encoders can and do malfunction, but they provide no mechanism for automatically detecting such errors. As a result, there is often considerable delay in determining that a malfunction has occurred. In the meantime, valuable observing time is lost when the dome does not point in the proper direction.

Other techniques have been employed, such as having a series of separate switches spaced at regular intervals around the circumference of the stationary part of the dome building; the separate switches were then tripped by a single detent on the moving part of the dome. This method required a tremendous number of switches and wires, and so it was quite costly and complex to maintain. To provide angular resolution comparable to that provided by the present invention, even on an average size dome, would require several thousand separate switches. Clearly, this technique does not offer the requisite economy, accuracy, and reliability.

One object of the invention is to solve these problems and to prevent their recurrence.

Because of these problems, various schemes of optical encoding have been tried or considered. All of these schemes involved placing one or more bands of stripes or codes around an inner surface of the rotating portion of the dome. These codes would be sensed by one or more optical sensors attached to the fixed portion of the dome. One such scheme, that of Calvin Delaney in 1979, was a single-track incremental encoder. A similar scheme was used in 1971 for an incremental encoder on the dome of the 40-cm photometric telescope of the Observatoire de Haute Provence, France. Other optical-based schemes that were considered would have used a wider coded band to make a multi-track Gray-code absolute encoder. However, none of these went into general use because of their excessive electronic and mechanical complexity and their susceptibility to skewing errors.

One proposed idea for solving these problems was to use inexpensive commercial fixed-beam bar-code readers to measure the absolute dome position. The idea was to place bar-code symbols around the inside of the rotating part of the dome, with the absolute position at each point directly encoded in the corresponding bar-code symbol. As the dome rotated, the bar-code symbols would be drawn past a fixed-beam bar-code reader, which would decode them and provide the absolute position of the dome.

Unfortunately, standard bar-code symbols cannot be scanned reliably this way. Although such symbols can be scanned at many different speeds and from either direction, the speed and direction during any single scan must remain reasonably constant. Since the dome speed or direction can change at any time, the normal motions of the dome cannot be used reliably to scan standard bar-code symbols.

Another object of the present invention is to overcome the problems that are inherent in prior-art optical encoders.

Another problem is presented by the fact that many domes are out-of-round. For example, each of the domes at both the 1-meter and 3-meter Lick Observatory telescopes is out-of-round by more than one inch, and this eccentricity exceeds the depth of focus of most inexpensive optical sensors. Further, besides being out-of-round, the encoder track surface at the dome of the 1-meter telescope at Lick Observatory exhibits considerable vertical warping. Such out-of-roundness and vertical warping would also complicate any mechanical coupling between such surfaces and a conventional position encoder.

An object of this invention is to overcome problems presented by out-of-round domes and by vertical warping.

A further object is to provide an encoder system with automatic detection of errors.

Other objects and advantages of the invention will appear from the following description.

SUMMARY OF THE INVENTION

The present invention provides absolute position encoding. As related to telescope domes, it uses the dome itself as a major component of the encoder. In the preferred form of the invention, the encoding is done optically. A band of material imprinted, engraved, or otherwise marked with a coded pattern of stripes is attached to an inner surface of the rotating portion of the dome. This pattern comprises a series of discrete bar-code symbols, with each symbol directly encoding the absolute position corresponding to that symbol's location on the band.

As the dome rotates, the bar-code symbols on the band move past a moving-beam or area-detector bar-code scanner attached either to a stationary part of the telescope housed inside the building or to a stationary part of the building itself. Note that the motion of the dome is not used to scan each bar-code symbol on the band. Rather, the scanning of each bar-code symbol is performed by the moving-beam or area-detector bar-code scanner. The bar-code scanner scans whichever bar-code symbol is currently positioned in front of it (i.e., within its overall field of view), and produces an electrical signal corresponding to the bar-code symbol being scanned. A bar-code decoder then decodes the signal from the bar-code scanner into the corresponding absolute position of the dome.

As an alternative, the bar-code symbols may be on the stationary member and the bar-code scanner supported on the movable member.

Because moving-beam and area-detector bar-code scanners may be configured to provide excellent depth of focus, and excellent immunity to tilting and skewing errors between the scanner and the object being scanned, they eliminate the need for any mechanical contact between the measuring device and the object whose position is being measured. In fact, depending on the size of the bar-code symbols being scanned, the bar-code scanner may be located up to several feet away from the object being scanned. Thus, the bar-code scanner may be rigidly mounted, even when used to scan bar-code symbols affixed to encoder track surfaces that are vertically warped and/or attached to out-of-round domes. Accordingly, the need for any mechanical linkages to correct for vertical warping or out-of-round domes is eliminated.

Since most bar-code symbolizes include various levels of check bits in each character of the code as well as check characters over the entire code symbol, use of bar-codes for position measurement can provide greater error detection capability than is currently provided by most conventional incremental or absolute encoders.

BRIEF DESCRIPTION OF THE DRAWINGS

FIG. 5 is a diagrammatic view of a rotating-mirror type of moving-beam bar-code scanner that may be used in an embodiment of the invention.

FIG. 7 is a diagrammatic view and box diagram showing a scanner reading means with its means for generating an analog signal voltage and sending the voltage to a decoding means indicating the absolute position of a movable member relative to a stationary member.

DESCRIPTION OF THE PREFERRED EMBODIMENT

Figure 1:
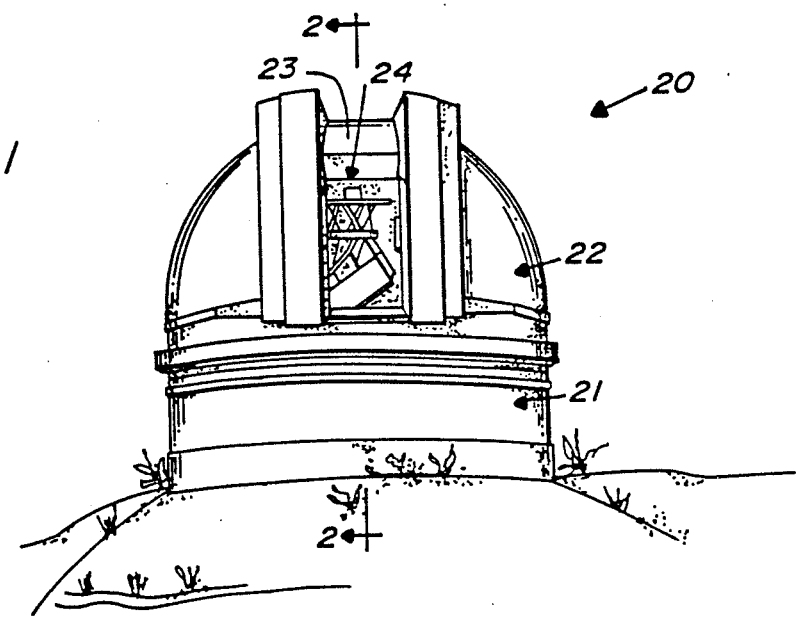
FIG. 1 is a view in elevation of the exterior of an observatory telescope dome building, showing the window or gap in the dome.
Figure 2:
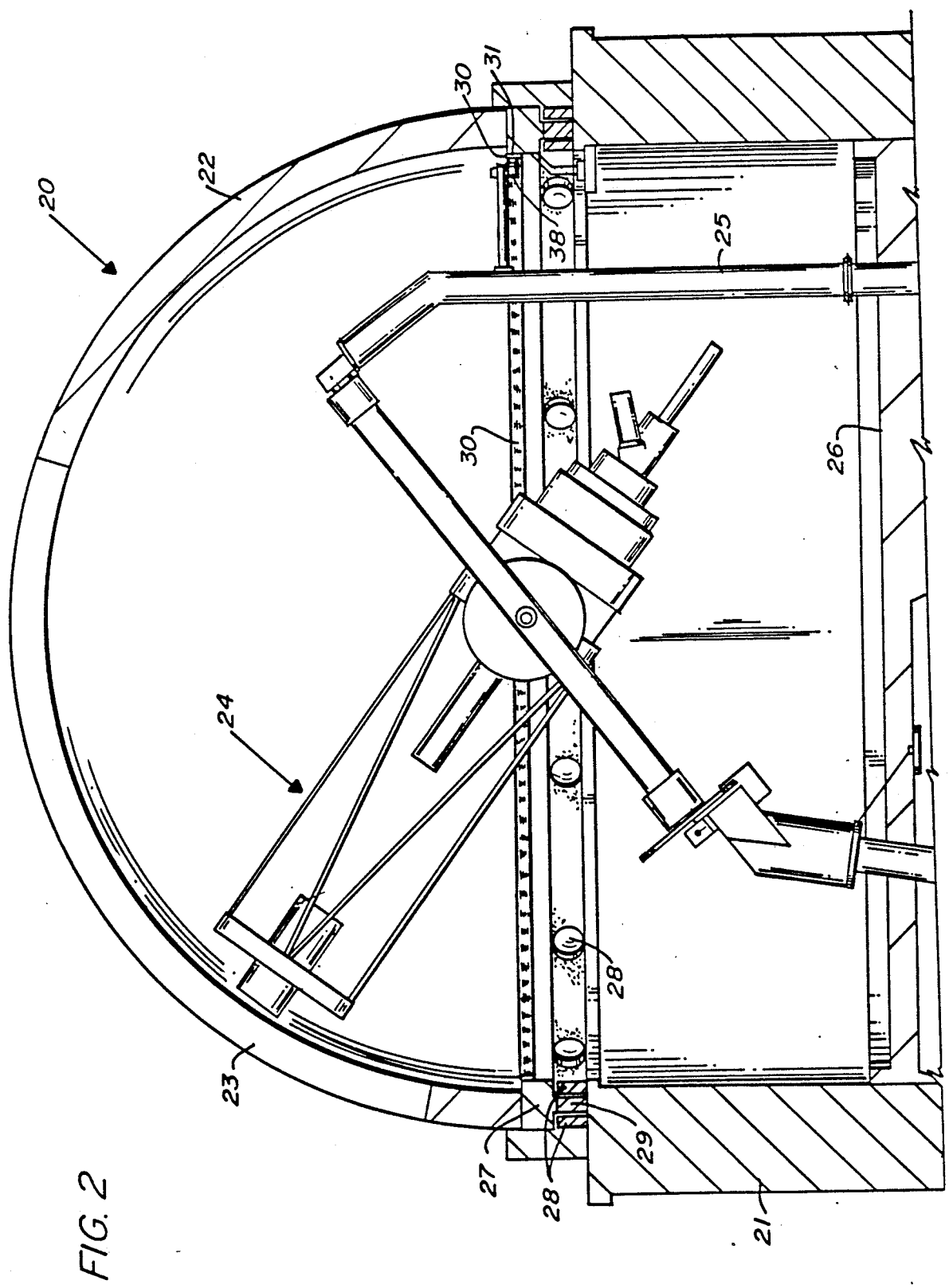
FIG. 2 is in elevation and in vertical section taken along the line 2—2 in FIG. 1

The dome 22 (FIGS. 1 and 2)

To exemplify the invention, FIG. 1 shows a telescope dome building 20 comprising a stationary cylindrical structure 21 with a rotatable dome 22 having a window, slit, or gap 23 with which a telescope 24 is aligned, the remainder of the dome 22 excluding unwanted stray light and affording shelter.

Inside the building 20, as shown in FIG. 2, is the telescope 24 rotatably and pivotally mounted on an upright member 25 that is stationary and is affixed to a floor or foundation 26. The telescope 24 moves independently of the rotatable dome 22. It is very important that they both can be properly aligned, so that the telescope 24 can look through the dome slit 23. The basic purpose of the encoder of this invention is to know the absolute position of the slit or window 23 at all times, so that the independent motion of the dome 22 can be coordinated with that of the telescope 24. Since the dome 22 and the telescope 24 may move within different coordinate reference frames, coordinated motion usually requires that they be driven at different rates of speed.

As shown in FIG. 2, the dome 22 has a lower circular edge 27 mounted on rollers 28 that ride on a circular track 29 at the upper edge of the stationary cylindrical structure 21.

The encoder band 30, track surface 31, and bar code symbols 36 or 46 (FIGS. 2, 3, 3A, 4, and 4A)

Figure 3:
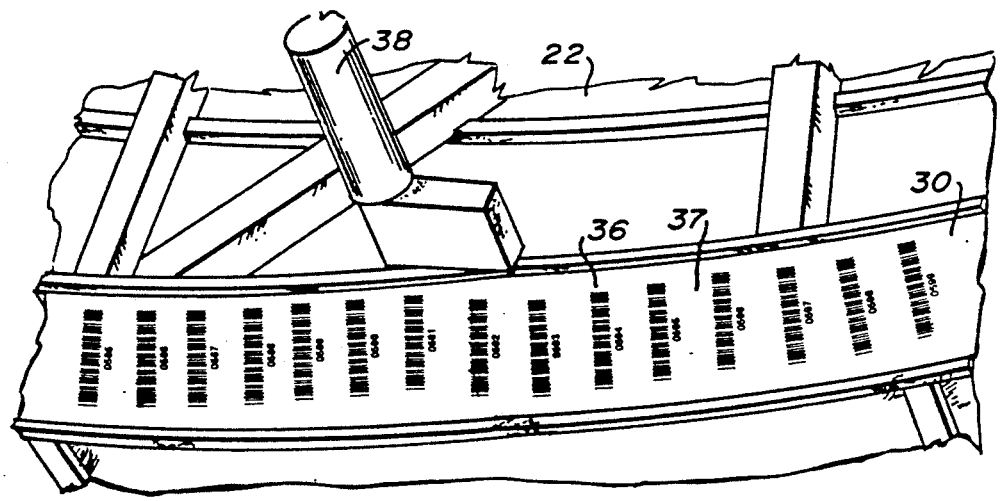
FIG. 3 is an enlarged fragmentary view in perspective of a portion of the dome building, showing portions of the bar-code track containing vertically-oriented bar-code symbols and the mounting of the bar-code scanner.
Figure 3A:
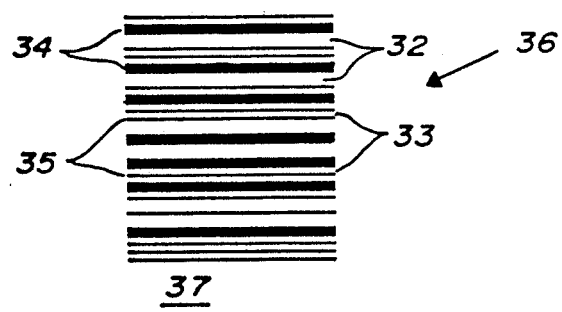
FIG. 3A is a further enlarged detailed view of the vertical bar codes.

As shown in FIG. 2, the dome 22 itself is a major component of the encoder of this invention. A band 30 that is imprinted, engraved, or otherwise marked with a coded pattern of stripes is attached to a generally cylindrical inner surface portion 31 of the rotating dome 22. As shown in FIGS. 3 and 3A, the band 30 may be a continuous, dome-encircling series of bar-code symbols 36. Each symbol 36 is distinct from all the other symbols 36 on the band 30. These bar-code symbols 36 are used to encode directly the absolute position corresponding to that symbol's location on the band 30. As shown in FIG. 3A, the bar-code symbols 36 are comprised of a series of light-reflecting wide rectangles 32 and narrow rectangles 33 alternating with dark (i.e., non-reflecting) wide rectangles 34 and narrow rectangles 35. The light-reflecting rectangles 32 and 33 are commonly referred to as "spaces", while the dark rectangles 34 and 35 are referred to as "bars".

The symbols 36 may be surrounded by areas of blank space 37 to provide what is commonly referred to as a "quiet zone". (A larger amount of blank space may be required for those edges that are perpendicular to the direction in which the symbol 36 is scanned than is required for those edges that are parallel to that direction.) This "quiet zone" 37 is used in recognizing the starting and ending points of each bar-code symbol 36, and may also be used in recognizing partial scans of the symbols 36.

In the preferred form of the invention, the bar-code symbols 36 may be oriented vertically on the band 30 (i.e., perpendicular to the plane of rotation of the dome 22) as shown in FIG. 3. Bar-code symbols oriented this way are commonly referred to as being in a "ladder-type" format. One benefit of this orientation is that different portions of the symbol 36 will be scanned as the dome 22 moves. Thus, any localized imperfections in the symbol 36 (such as might result from scratches or dirt) which cause reading errors during a given scan of the symbol 36 are less likely to cause errors on subsequent scans of this symbol that occur after the dome 22 has moved the area of imperfection out of the path of the scan. Another benefit of this orientation is that the motion of the dome 22 is perpendicular to the direction in which the symbol 36 is scanned. Thus, movement of the dome 22 that occurs while the symbol 36 is being scanned will not cause the symbol 36 to be scanned at an unsteady rate.

The vertical orientation allows the symbols 36 to be packed quite closely together on the band 30. Note that as the size and/or resolution of the band 30 is increased, so is the number of symbols 36 contained in the band 30. As the number of symbols 36 is increased, the number of digits or characters of information that must be encoded in each symbol 36 is also increased. Hence, the number of bars 34 and 35 and spaces 32 and 33 needed to generate each symbol 36 increases as well, and the amount of space required by each symbol 36 grows accordingly. By using the ladder-type format, this increase in the space required by each symbol 36 occurs in the vertical dimension. Thus, as the size and/or resolution of the encoder band 30 is increased, the vertical dimension of the band 30 must grow accordingly. However, with the ladder-type format, the horizontal spacing between the symbols 36 can remain constant regardless of the number of symbols 36 on the band 30.

The limit on how tightly the ladder-type format symbols 36 may be packed together on the band 30 is a function of the scanning tolerances of the bar-code scanner 38 used to scan them, the required size of the quiet zone 37, and the horizontal width of each symbol 36. The horizontal width of each symbol 36 is set by the maximum rotational speed of the dome 22, the scan rate of the bar-code scanner 38 which scans them, and the desired minimum number of scans (usually at least 3) of the symbol 36 to be obtained as it moves through the overall field of view of the bar-code scanner 38.

Figure 4:
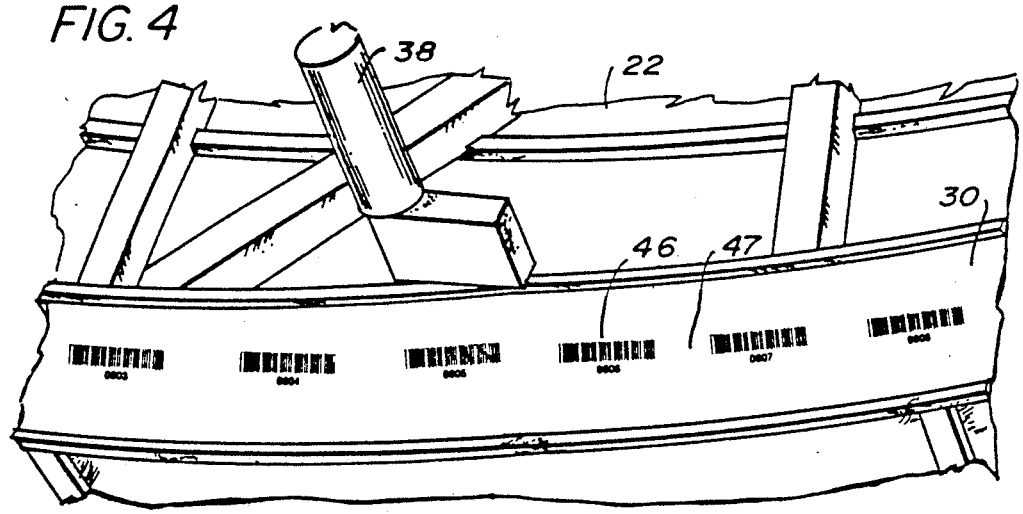
FIG. 4 view like FIG. 3, showing the bar-code symbols oriented horizontally on the bar-code track.
Figure 4A:
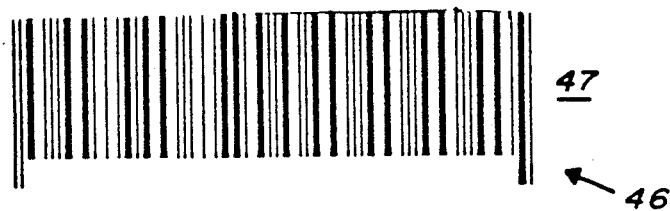
FIG. 4A is a further enlarged view of the horizontal bar codes.

If the scan rate of the bar code scanner 38 is sufficiently fast relative to the maximum rotational speed and acceleration of the dome 22, then the invention may also use horizontally oriented bar-code symbols 46 on the band 30 (i.e., parallel to the plane of rotation of the dome 22) as shown in FIG. 4. Bar-code symbols 46 oriented this way are commonly referred to as being in the "picket fence-type" format. This orientation allows the vertical dimension of the encoder band 30 to be kept to a minimum, and to remain constant if the number of symbols 46 on the band 30 is increased. However, this occurs at the expense of reducing the number of symbols 46 that can be packed onto a given size band 30. As described earlier, as the size and/or resolution of the band 30 is increased, there is a corresponding increase in the number of symbols 46, the number of digits of information contained within each symbol 46, and hence the amount of space required by each symbol 46. This increase in the amount of space required by each picket fence-type format symbol 46 occurs in the horizontal dimension, and thus decreases the packing density of the symbols 46 on the band 30. Furthermore, a significant area of blank space 47 is usually required in between the picket fence-type format symbols 46 in order to satisfy the "quiet zone" requirements imposed by most bar-code symbologies.

The bar-code symbols 36 or 46 may be applied to the encoder track surface 31 in a variety of ways. They may be printed on a continuous roll of material, which is then unrolled and affixed to the surface 31 to form the band 30. The band 30 may be affixed to the surface 31 by a suitable adhesive, or by some arrangement of clips or fasteners. Alternatively, the symbols 36 or 46 may be printed, individually or in groups, onto separate segments which are then individually affixed to the surface 31 to form the band 30. A variety of printing processes (such as phototypesetting or ion projection electrographic printing) may be employed to print the sequential series of bar-code symbols 36 or 46 onto either the rolls or segments used to form the complete band 30. In addition, there is a wide variety of materials (such as polyester or vinyl films, or metal foils) on which the symbols 36 or 46 may be printed, and protective overlays (such as plastic laminations or varnish coatings) which may be applied after the symbols 36 or 46 are printed. It may also be possible to engrave or otherwise mark the symbols 36 or 46 either onto the band 30 or directly onto the surface 31, by means of a relatively high-power laser marking device such as a YAG laser. The YAG laser may be used to either evaporate a coating from coated materials (such as anodized aluminum), or to burn a channel in bare metals such as steel or aluminum.

In any case, the bar code symbols 36 or 46 that are produced by any of the above described methods must provide sufficient contrast between the bars 34 and 35 and spaces 32 and 33 of the symbol when viewed at the wavelength of light utilized by the bar-code scanner 38 which scans the symbols 36 or 46. The materials selected for fabricating the bar-code symbols 36 or 46 should be chosen to provide the best contrast consistent with other constraints such as cost and durability. The selected materials should also be chosen to minimize the overall glossiness of the symbol, so as to reduce scanning problems that result from specular reflection.

A good overview of the various printing and engraving technologies that may be used to generate bar-code symbols 36 or 46 for the encoder band 30 is presented in the paper entitled "Encoding Information" by Kathleen Parsons of RJS Enterprises, Inc., contained in the Proceedings of the Scan-Tech 85 Seminar held Dec. 2-5, 1985 at the Baltimore Convention Center, and available from the Automatic Identification Manufacturers (AIM) Inc., 1326 Freeport Road, Pittsburgh, Pa. 15238. A more recent paper on this subject is entitled "Off-Site Printed Bar Codes", by Keith Harnick of the Grand Rapids Label Co. and contained in the Proceedings of the Scan-Tech 86 Seminar held Oct. 15–17 in the Moscone Center in San Francisco, and also available from AIM.

The encoding of bar-code symbols 36 and 46

As described earlier, a bar-code symbol 36 or 46 may be comprised of a parallel series of varying width light-reflecting spaces 32 and 33 and dark (i.e., non-reflecting) bars 34 and 35. The rules or algorithms that specify how data is encoded into the bar and space widths define a particular bar-code "symbology". In fact, there are two distinct classes of bar-code symbologies: "two-width" symbologies (like those already described) in which there are only 2 possible widths (wide and narrow) for the bars and spaces, and "multiple-width" symbologies, in which there are more than 2 widths. In the case of "two-width" symbologies, the ratio of the widths between the wide and narrow elements (where the elements are the bars or spaces) is normally in the range from 2.0 to 3.0, but will be constant for any given bar-code symbol. In the case of "multiple-width" symbologies, the widths of the bars and spaces may be one of a number of different values, but in most cases will be an integral multiple of some basic unit or module defined for the given symbology; usually, this unit or module corresponds to the narrowest bar or space in the symbol. In order to simplify the description, the use of a "two-width" symbology is assumed in FIGS. 3 and 4, even though this invention may utilize symbologies of either (i.e., "two-width" or "multiple-width") type.

There are many industry-standard symbologies, such as Uniform Product Code (abbreviated as "UPC"), European Article Numbering ("EAN"), Interleaved 2 of 5 (I2/5), Codabar, Code 39, Code 128, and Code 93, as well as variant forms of each of these symbologies. Interleaved 2 of 5 (I2/5) and Code 39 are examples of "two-width" symbologies, while UPC, EAN, Code 93, and Code 128 are examples of "multiple-width" symbologies in which the number of widths is either 3 or 4. Some of these symbologies (such as I2/5, UPC, and EAN) can only encode numeric characters (i.e., the decimal digits 0 to 9), while others (such as Code 39, Code 93, and Code 128) can encode alphanumeric characters (i.e., the letters A to Z, digits 0 to 9, plus punctuation and other special characters). Some symbologies (such as Codabar) can encode numeric characters plus only a small number (e.g., 6) of special characters such as punctuation marks. The set of characters that can be encoded by a given symbology is referred to as the "character set" of that symbology.

The specifications for many of these symbologies are given in ANSI standard MH10.8M-1983, and in the Uniform Symbology Specifications (USS-I 2/5, USS-Codabar, USS-39, USS128, USS-93) published by the Automatic Identification Manufacturers (AIM). Additional specifications relating to Code 39 may be found in Department of Defense standards MIL-STD 1189 and MIL-STD 1189A. A good overview of the most commonly used bar-code symbologies is given in a paper by Roger C. Palmer of the INTERMEC Corporation, entitled "Bar codes: The Major Symbologies", contained in the Proceedings of the Scan-Tech 85 seminar held Dec. 2–5, 1985 at the Baltimore Convention Center, and available from the Automatic Identification Manufacturers (AIM).

A complete ladder-type bar-code symbol 36 comprises a combination of "characters", each character comprised of varying width spaces 32 and 33 and bars 34 and 35. This combination of characters includes the quiet zones 37, a start character 39, and a stop character 40, as well as the intervening data characters 41 and any optional check characters 42 which may be required by a particular symbology. The start character 39 and stop character 40 may comprise the same pattern of bars 34 and 35 and spaces 32 and 33, or may be different, depending on the symbology in use. The start character 39 and its preceding quiet zone 37 indicate the starting point of the symbol 36, while the stop character 40 and its following quiet zone 37 indicate the ending point of the symbol 36.

Similarly, a complete picket fence-type bar-code symbol 46 comprises a combination of the quiet zones 47, a start character 49, stop character 50, intervening data characters 51, and optional check characters 52. The start character 49 is normally at the left-hand edge of a picket fence-type symbol 46, while the stop character 50 is at the right-hand edge. FIGS. 9 to 12 show how the quiet zones 47 and the start 49, stop 50, data 51, and optional check characters 52 are contained within sample picket fence-type bar-code symbols 46; each of these figures illustrates a different bar-code symbology.

In addition to marking the starting and ending points of the symbols 36 or 46, the start character 39 or 49 and stop character 40 or 50 may be used to determine the direction in which the symbol 36 or 46 was scanned. While the start character 39 or 49 and stop character 40 or 50 and any optional check characters 42 or 52 are used by the bar-code decoder 100 to decode (and validate) the bar-code symbol 36 or 46, these characters are not normally displayed, output, or otherwise transmitted by the decoder 100. Only the data characters 41 or 51, which contain the actual data that is encoded in the symbol 36 or 46, are usually displayed, output, or otherwise transmitted by the decoder 100.

However, some symbologies (such as Codabar) provide more than one pattern (e.g., 4 patterns) of bars 34 and 35 and spaces 32 and 33 for use as start characters 39 or 49 and stop characters 40 or 50. This allows a limited amount of data to be encoded in these characters. Other symbologies providing multiple patterns for the start 39 or 49 and stop 40 or 50 characters may use these patterns to select between alternate interpretations of the data characters 41 or 51. In any case, the patterns assigned to start 39 or 49 and stop 40 or 50 characters are usually distinct from the patterns used for the data 41 or 51 or check 42 or 52 characters, and are only considered valid when encountered adjacent to the appropriate quiet zone 37 or 47.

Other parameters of the bar-code symbols 36 and 46

The "length" of a bar-code symbol 36 or 46 is measure along the path over which the symbol is scanned, and is thus a function of the size of the quiet zone 37 or 47 and the number of characters 39, 40, 41, and 42, or 49, 50, 51, and 52 in the symbol 36 or 46. For a picket fence-type symbol 46, the length is measured horizontally, while for a ladder-type symbol 36, the length is measured vertically. The symbol length sets the minimum overall field of view that the bar-code scanner 38 must provide over the depth of focus range in which it operates. In some cases, the length of the symbol 36 or 46 may also affect the scanning rate that the scanner 38 must provide. In the case of a picket fence-type symbol 46 moving horizontally at a given speed through a given field of view of a horizontally-scanning scanner 38, the greater the length of the symbol 46, the shorter the period of time that the complete symbol 46 will be within the field of view of the scanner 38. The same is true for a ladder-type symbol 36 moving vertically at a given speed through a given field of view of a vertically-scanning scanner 38.

The "height" of a bar-code symbol 36 or 46 is measured in the dimension perpendicular to the symbol's length. For a picket fence-type symbol 46, the height is measured vertically, while for a ladder-type symbol 36, the height is measured horizontally. In some cases, the height of the symbol 36 or 46 will affect the scanning rate that the scanner 38 must provide. In the case of a ladder-type symbol 36 moving horizontally at a given speed through a given field of view of a vertically-scanning scanner 38, the greater the "height" (where "height", in this case, is measured horizontally) of the symbol 36, the longer the period of time the complete symbol 36 will be within the field of view of the scanner 38. The same is true for a picket fence-type symbol 46 moving vertically at a given speed through a given field of view of a horizontally-scanning scanner 38.

The "resolution" of a bar-code symbol 36 or 46 is usually defined in terms of the width of the narrowest element (bar 35 or space 33) of the symbol, and sets the required resolution of the bar-code scanner 38 used to read the symbols 36 or 46. The width of the narrowest element is commonly referred to as the "X" dimension of the symbol, and in most cases the widths of the other elements of the symbol are integral multiples of this "X" dimension. In general, the smaller the value of "X", the higher the resolution required, and the smaller the depth of focus provided by the scanner 38. Typical values for X for common symbol sizes range from 0.0075 inch to 0.08 inch. Since the depth of focus provided by typical scanners 38 is on the order of 500 times X, the depth of focus may vary, respectively, from 3.75 to 40 inches.

The effective depth of focus of the scanner 38, and the apparent "length" and "height" of the symbols 36 or 46 will be affected by variations in the pitch, tilt, and skew of the symbols. In the case of symbols 36 or 46 on the encoder band 30 of the dome 22, variations in pitch correspond to variations in the vertical warp of the encoder track surface 31. Similarly, variations in skew correspond to variations in the horizontal warp, if any, of the surface 31. Variations in tilt correspond to a symbol being misaligned from either of the two standard orientations (i.e., a ladder-type symbol 36 tilted from the nominal vertical alignment, or a picket fence-type symbol 46 tilted from the nominal horizontal alignment). For ladder-type symbols 36 moving horizontally past the scanner 38, tilt errors reduce the effective height of the symbol 36, since fewer scans will traverse all of the quiet zones, bars, and spaces of the symbol. Similarly, skew errors will reduce the apparent height of the symbol, thus also reducing the number of scan opportunities. Pitch errors will increase the depth of focus requirement of the scanner 38. For picket fence-type symbols 46 moving horizontally past the scanner 38, tilt errors reduce the number of scan opportunities, since fewer scans will traverse the complete symbol. Skew errors increase the depth of focus requirement of the scanner 38, and pitch errors reduce the apparent height of the symbol and hence the number of scan opportunities.

The particular bar-code symbology selected for encoding the bar-code symbols 36 or 46 depends on a number of factors, including: the total number of such symbols that will be needed on the band 30, the desired orientation of the symbols 36 or 46 on the band 30 (i.e., ladder-type format 36 or picket fence-type format 46), the desired spacing between the symbols 36 or 46, the level of error-checking desired for the symbols 36 or 46, the characteristics of the bar-code scanner 38 used to scan the symbols 36 or 46 and of the bar-code decoder 100 used to decode them into the corresponding absolute position, and the physical units in which the absolute positions are to be encoded.

For example, in an application requiring dome position to be encoded in units of integral degrees, a total of 360 bar-code symbols 36 or 46 would need to fit onto the encoder band 30, and a symbology capable of encoding only numeric characters (such as I2/5) may be adequate. (However, an alphanumeric code such as Code 128 might be preferred because of the high symbol density it provides for numeric-only data, and because of its more robust error detection capabilities.) The size of the symbols 36 or 46 and the spacing between them would be adjusted to fit the desired number of symbols 36 or 46 onto a given size band 30. The 360 bar-code symbols 36 or 46 would encode the data values 0 to 359, corresponding to the absolute position (in degrees) of each symbol 36 or 46 on the band 30. Each such bar-code symbol 36 or 46 would need to encode at least 3 decimal digits of information so as to encode all values between 0 and 359. Additional check bits (i.e., bars or spaces) and check characters may be included within the symbol 36 or 46 to provide the desired level of error-detection and/or error-correction, depending upon the symbology selected.

In another application requiring dome position to be encoded in units of tenths of degrees, a total of 3600 barcode symbols 36 or 46 would need to fit onto the band 30, and a symbology capable of encoding both numeric characters and a decimal point (such as Codabar) may be used. The 3600 bar-code symbols 6 or 46 in this example would encode the values 0.0 to 359.9, corresponding to the absolute position (in tenths of degrees) of each symbol 36 or 46 on the band 30. Each such bar-code symbol 36 or 46 would need to encode at least 5 characters of information (including the decimal point) so as to encode all values between 0.0 and 359.9. Additional check bits (i.e., bars and spaces) and check characters may be included to provide the desired level of error-detection and/or correction, and are included in many of the existing symbologies.

Many possible variations of units of measurement and choices of bar-code symbology are possible. Further, in addition to the symbologies described above and others currently in use, it is possible that additional bar-code symbologies will be developed in the future. The measurement scheme of this invention is sufficiently general to encompass these variations.

The bar-code scanner 38

A bar-code scanner 38 is a device which is used to scan a bar-code symbol 36 or 46 and to produce an analog (or in some cases a digital) signal voltage corresponding to the resulting pattern of light reflected from that symbol 36 or 46. Since more light is reflected from the light spaces 32 or 33 than from the dark bars 34 or 35, the resulting analog signal voltage will rise or fall depending on whether the scanner is sensing a space or a bar.

FIG. 7 shows a block diagram of a system to read bar-codes, and includes a bar-code scanner 38. The scanner 38 uses a light source 61 (which in some cases may be external to the scanner 38) to illuminate a bar-code 36 or 46. A portion of the light reflected from the symbol 36 or 46 is focused by some type of optical system 62 onto a photodetector 63. The output of the photodetector 63 is amplified by an analog amplifier 64, producing an analog signal voltage 65. The analog voltage 65 may then be converted to a digital signal 67 by an analog to digital converter 66. This converter 66 may be a part of the scanner 38, or may be part of the bar-code decoder 100 to which the output 65 or 67 of the scanner 38 is connected. The bar-code decoder 100 decodes the signal 65 or 67 into the corresponding absolute position of the symbol 36 or 46 on the encoder band 30.

In the encoder of this invention, the bar-code scanner 38 is rigidly mounted to a stationary portion of the dome building 21, and is used to scan bar-code symbols 36 or 46 affixed to the encoder track surface 31 on the moving part of the dome 22. However, as pointed out earlier, not all types of bar-code scanners 38 can perform this task. In particular, fixed-beam bar-code scanners cannot, while moving-beam and area-detector scanners can.

Bar-code scanners are described in some detail in numerous publications of the Automatic Identification Manufacturers (AIM), including the series titled "Scanning Products on the Move, Part I: Moving Beam Scanners" and "Part III: Fixed Beam Scanners", which describe these two distinct classes of bar-code scanners. A good overview of bar-code scanners is provided in the paper by John Sien of Hewlett-Packard entitled "Bar Code Scanners", and contained in the Proceedings of the Scan-Tech 85 seminar held Dec. 2–5, 1985 at the Baltimore Convention Center and which is available from AIM. A more recent paper on this subject is the paper entitled "Bar Code Readers an Scanners" by Greg Huber of Hewlett-Packard Corporation, contained in the Proceedings of the Scan-Tech 86 seminar held Oct. 15–17 at the Moscone Center in San Francisco, and which is also available from AIM.

The significant differences between fixed-beam, moving-beam, and area-detector bar-code scanners are summarized in the following sections.

Fixed-beam scanners (not used in this invention)

A fixed-beam bar-code scanner (which is not used in this invention) is relatively inexpensive, usually contains no moving parts, and emits a stationary light beam. It relies upon some other motion, such as motion of the entire scanner or motion of the object being scanned, to scan a bar-code symbol. The hand-held wand-shaped scanners that are often used to scan bar-code tags on retail merchandise are one example of this variety of scanner. Such devices require the operator to sweep the wand across the tag at a relatively smooth, steady rate. If, instead, the wand is held stationary, then the tag containing the bar-code symbol must be swept past the wand at a relatively smooth, steady rate. Since a telescope dome does not move at a smooth, steady rate, but rather can change speed or direction at any time, the normal motions of the dome cannot provide the smooth, steady scanning motion required by a rigidly-mounted fixed-beam bar-code scanner to read (picket fence-type) bar-code symbols reliably on the moving part of the dome. (Note that for objects which move only in one direction and at a relatively steady speed, a rigidly-mounted fixed-beam bar-code scanner may be used to scan bar-code symbols affixed to the object, and thus measure its absolute position. In this case, the symbols must be oriented so that their length is parallel to the direction of motion of the object.)

A moving-beam scanner 70 (FIG. 5)

A moving-beam scanner 70 may be used as the bar-code scanner 38. Note that a moving-beam scanner 70 is usually more expensive than a fixed-beam scanner, and contains moving parts (such as an oscillating flat mirror or rotating polygonal mirror 71) that are used to sweep a relatively powerful light beam 72 (usually a laser beam) across the object being scanned. Thus, FIG. 5 shows diagrammatically a moving-beam scanner 70 having a rotating mirror 71 with a laser beam 72 generated by a laser transmitter 73. (Typically, the laser transmitter 73 may be either a helium-neon laser operating at a visible wavelength of 633 nanometers, or a gallium arsenide solid state laser operating in the near infrared at a wavelength of 900 nanometers.) The transmitter 73 sends the beam 72 through focusing optics 84 and then through a slit 77 in a flat mirror 78 to another flat mirror 79 which directs the beam 72 to the rotating mirror 71. The mirror 71 sends a resultant scanner beam 74 through a slit or opening 75 in a housing 76 to the band 30. A portion of the light from the scanning beam 74 is reflected by the band 30 and forms a return beam 85 which travels, via the mirrors 71, 79, and 78, to a receiver lens system 80. The beam 85 passes through the lens system 80 and strikes an opto-electric detector 81 (which may be a photodiode). The output of the detector 81 connects to an analog signal amplifier 82, which produces an analog signal voltage 83. The signal 83 is connected to a bar-code decoder 100, where it may be converted to digital form and decoded into the absolute position of the symbol 36 or 46 on the band 30.

The sweeping light beam 74 of the scanner 70 provides the smooth, steady scanning motion required to read a bar-code symbol 36 or 46 reliably from the band 30. The spot size of the beam 74 determines the width of the narrowest bar or space (i.e., the X dimension of the symbol) that the scanner 70 can resolve. If the spot size is too large, the narrowest bars and spaces will not be resolved, and will appear as a gray blur. If the spot size is too small, the scanner 70 will detect minor imperfections in the symbols (as might be caused by dirt, scratches, or printing voids) as if they were bars or spaces. Note that the spot size of the beam 74 will increase slowly with increasing distance from the scanner 70, although this effect may be reduced by collimating optics, at the expense of decreasing the depth of focus.

In addition, while the angular speed of the scanning beam 74 remains reasonably constant, the linear speed of the beam's sweep increases with increasing distance from the scanner, thus causing the symbols 36 or 46 to be scanned more rapidly. If a given size symbol is scanned too fast, the resulting signals may be too rapid to be decoded by some bar-code decoders 100. As a result of these problems, the X dimension of the symbols 36 or 46 may need to be increased as the distance between the symbols and the scanner 70 is increased, since increasing the X dimension compensates for the effects of increased spot size and sweep speed of the scanning beam 74.

The overall field of view of the scanner 70 (i.e., the area swept by the scanning beam 74) must fit the length of the symbols 36 or 46 over the entire depth of focus range utilized. (The area swept by the scanning beam 74 is sometimes referred to as the "height-of-scan" of the scanner 70. This should not be confused with the "height" of a symbol being scanned, since symbols are scanned in the "length" dimension, i.e, perpendicular to the symbol's "height"). Finally, note that if the scan rate of the scanner 70 is increased by increasing the numbers of faces on the polygonal mirror 71, the overall field of view of the scanner 70 will be reduced accordingly. Moving-beam bar-code scanners can now achieve scan rates in excess of 700 scans per second. (A suitable moving-beam bar-code scanner that may be used to measure the position of a telescope dome is the Microscan MS-1000 moving-beam scanner by Microscan Systems, Inc., of Tukwila, Wash.)

Figure 6:
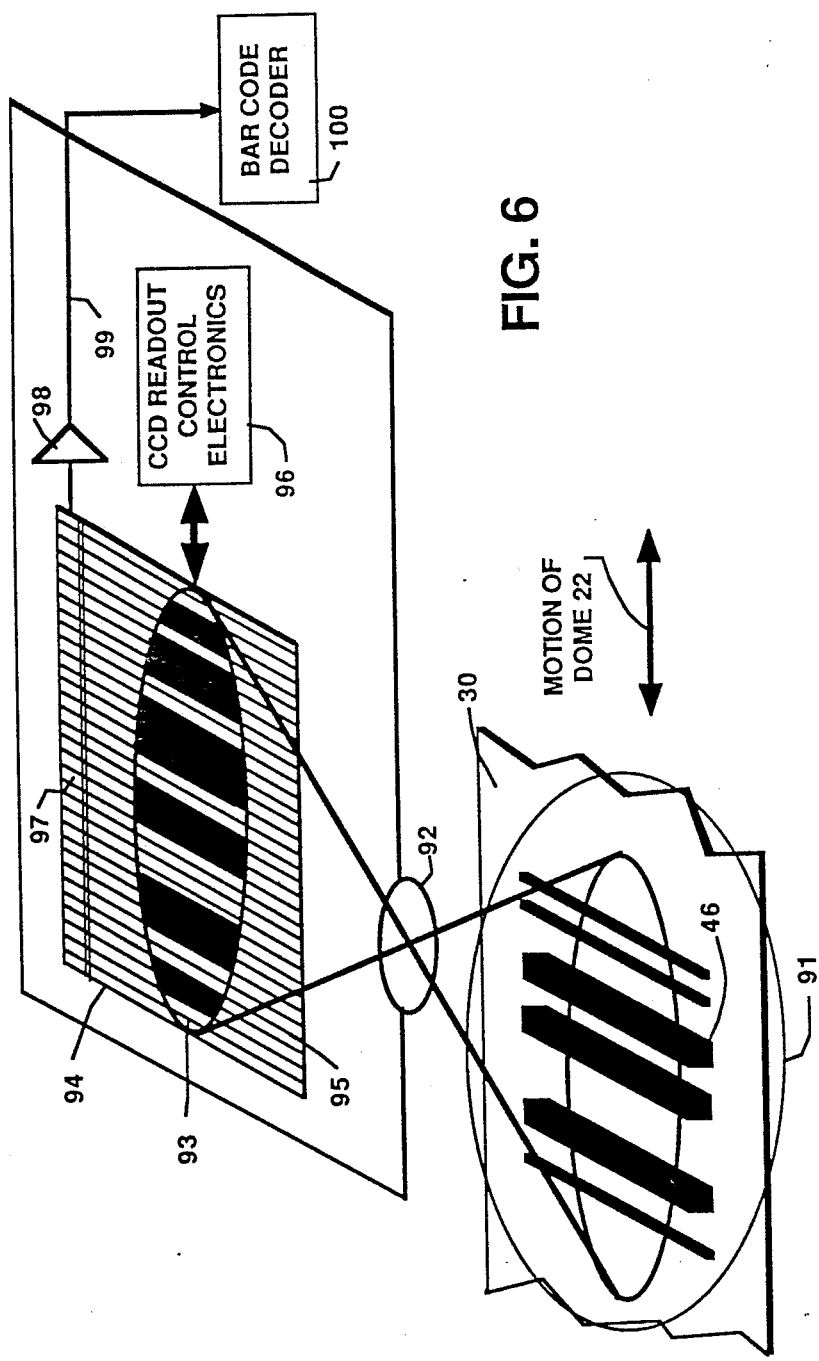
FIG. 6 is a diagrammatic view of an area-detector bar-code scanner that may be used in an embodiment of this invention.

An area-detector scanner 90 (FIG. 6)

Area-detector bar-code scanners 90 (also referred to as imaging-array bar-code scanners) are relatively expensive, contain no moving parts, and usually emit no light. FIG. 6 shows diagrammatically a highly-simplified view of an area-detector bar-code scanner 90. The band 30 is illuminated by an external fixed light source 91, and an optical system 92 (which may comprise a lens and/or pinhole or slit) projects an image 93 of the bar code symbol 46 upon the area detector or imaging-array 94, which may be a linear CCD array. The imaging-array 94 comprises a matrix of thousands of individual microscopic optical detectors 95. The detectors 95 are commonly referred to as picture elements, or pixels. Each pixel 95 converts incident light into an electric charge that is stored in the pixel. As more light falls on a pixel 95, the charge stored in that pixel increases. The pixels 95 are arranged in a matrix having one or more rows and many (typically hundreds) of columns. Readout control electronics 96 connected to the imaging array 94 are used to read out serially the accumulated charge from each of the pixels 95. The control electronics 96 generates waveforms which are applied to the control lines on the imaging-array 94, and which cause the charge contained in the pixels 95 of each row to be shifted into the corresponding pixels 95 of the next higher row of the matrix. The charge contained in the pixels 95 of the topmost row is shifted into the corresponding pixels of a charge shift register 97 contained within the imaging-array 94. The control electronics 96 also generate waveforms used to serially shift the charge contained in the pixels of the charge shift register 97 into an analog amplifier 98 to produce an analog signal voltage 99. The resulting signal 99 corresponds to the bar code symbol 46 currently being imaged by the imaging-array 94.

The area-detector bar code scanner 90 "scans" the symbol 46 by electronically shifting (or "reading-out") the image of the symbol out of the imaging-array. The sequential read-out of the imaging-array takes place very quickly (typically 2 milliseconds per read-out, or "scan"), thus allowing effective scan rates of 500 scans per second. By appropriate selection of the optical system 92, the scanner 90 may be configured to operate at various distances up to several feet from the object being scanned (i.e., imaged). Various sizes of bar-code symbols 36 or 46 may be used, provided there are sufficient pixels in each row of the imaging-array 94 to both resolve and contain the projected image 93 of the bar-code symbol 36 or 46. The depth of focus of the scanner 90 will depend on the focal length and aperture of the optical system 92, which in turn depends on the intensity of the light source 91 and the inherent sensitivity of the imaging-array 94. (Examples of suitable area-detector bar-code scanners 90 that may be used to measure the position of a telescope dome include the Datalogic TC6 and Datalogic TC200, by Datalogic Optic Electronics of Rocky River, Ohio).

Common parameters of the bar-code scanners 38, 70, and 90.

Because they both can actively and rapidly scan bar-code symbols 36 and 46, moving-beam bar-code scanners 70 and area-detector bar-code scanners 90 may be considered as functionally equivalent. An area-detector bar-code scanner 90 has many of the advantages of a moving-beam scanner 70, but without the need for moving parts such as oscillating or rotating mirrors 71. However, area-detector scanners 90 are currently much more expensive than comparable moving-beam scanners 70.

Note that neither the moving-beam bar-code scanners 70 nor the area-detector bar-code scanners 90 rely on the relative motion between the scanner and the object being scanned to provide the actual scanning of the bar-code, but rely instead on either the sweeping motion of a moving light beam or the electronic sweeping of the area detector to provide the smooth, steady scanning motion that is required.

If the sweep rate of a moving-beam or area-detector bar-code scanner 70 or 90 is sufficiently fast relative to the motion of the object being scanned, the apparent motion of the object (as seen by the scanner) may be ignored. Put another way, each "sweep" of the scanner is similar to taking a short-exposure snapshot of the bar-code symbol being scanned. Thus, while the object whose position to be measured (in this case, a telescope dome) may be moving moderately fast and/or irregularly, as long as the maximum speed and acceleration of this motion is sufficiently small relative to the speed of the scanner's sweep, the object's motion is effectively cancelled out. Accordingly, a rigidly-mounted high-sweep-rate moving-beam or area-detector bar-code scanner 70 or 90 is not significantly affected by such motions and may be used reliably to read picket fence type bar-code symbols 46 affixed to the band 30 on the rotating part of a telescope dome 22.

In the case of the ladder-type symbols 36, the motion of the dome 22 is perpendicular to the direction in which the symbols 36 are scanned, and thus does not affect the smoothness of the scanning. However, ladder-type symbols 36 must be of sufficient "height" and the scan rate of the scanner 38 sufficiently fast so that, even at the maximum rotation rate of the dome 22, the symbol 36 will remain in the field of view of the scanner 38 sufficiently long so that it may be completely scanned at least once, and preferably, three times.

As mentioned earlier, moving-beam and area-detector bar-code scanners typically may provide very large depth of focus (from several inches to several feet, depending on factors such as symbol resolution and illumination intensity) and in many cases can successfully scan bar-code symbols 36 or 46 that are tilted 30 to 45 degrees from the plane of the scan. These characteristics allow such scanners to be rigidly mounted and to read reliably bar-code symbols 36 or 46 from the encoder track surface 31 on domes 22, even when such tracks 31 exhibit considerable vertical warping and even when such domes 22 are significantly out-of-round.

Depending on the type of materials used to produce the bar-code symbols 36 or 46, the underlying band 30, and the encoder track surface 31, specular reflection from any of these may confuse the scanner 38 and make it difficult for the scanner to distinguish the dark areas (bars) or light areas (spaces) from each other or from the surrounding background. This problem may be reduced by using flat, matte finishes (and avoiding the use of glossy finishes or polished surfaces) for the symbols 36 or 46, band 30, or track surface 31. The problem of specular reflection may also be reduced by mounting the scanner 38 so that its line-of-sight to the symbol 36 or 46 is tilted a few degrees relative to a line normal to the surface of the symbol 36 or 46.

It should also be noted that the illumination sources 73 or 91 used by moving-beam scanners 70 or area-detector scanners 90 may cause significant amounts of stray light to be reflected or scattered from surfaces illuminated by these illumination sources 73 or 91. When used in an application such as encoding the position of a telescope dome 22, any such stray light must be prevented from reaching the telescope 24. Thus, light shrouds and baffles may be needed around such scanners 70 or 90, illumination sources 91, and the portion of the encoder band 30 and encoder track surface 31 which passes in front of the scanner 70 or 90. If the dome 22 has its slit 23 opened during the daytime, such shrouds and baffles may also help to prevent direct sunlight from reaching the scanner and confusing it.

Finally, it should be noted that in the implementations illustrated so far, there are certain positions of the dome in which a complete bar-code symbol 36 or 46 may not always be within the field of view of the bar-code scanner 38. For example, in FIG. 3, no symbol 36 will be detected when a moving-beam scanner's beam sweeps in between two adjacent symbols 36. Similarly, in FIG. 4, a symbol 46 will not be detected if it is not contained completely within the scanner's field of view. However, in cases where this presents a problem, one may use particular types of moving-beam and area-detector bar-code scanners which can scan for bar-code symbols in more than one dimension and/or over fairly large areas, allowing detection of bar-codes located anywhere with such a scanner's expanded field of view. (Unfortunately, such scanners are very expensive, and often involve a fairly complicated arrangement of moving mirrors.) By employing these types of scanners, and by utilizing a suitable arrangement of bar-code symbols 36 or 46 on the encoder band 30, one may insure that at least one bar-code symbol 36 or 46 is always within such a scanner's field of view, regardless of the position of the dome 22. In some cases, more than one symbol may be within the field of view of the scanner, and both such symbols will be decoded. This would be interpreted as indicating that the dome 22 is positioned at a point in between the two readings produced by the two adjacent bar-code symbols.

The bar-code decoder 100

Figure 8:
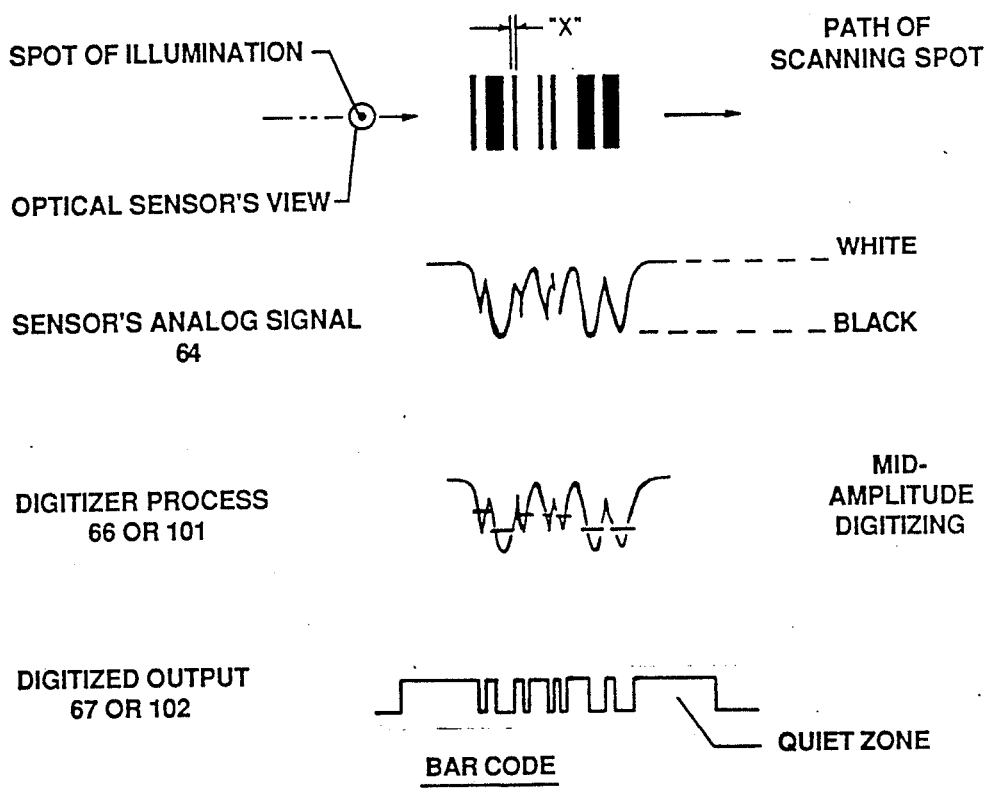
FIG. 8 is a diagrammatic view of the bar-code scanning process.
Figures 9, 10:
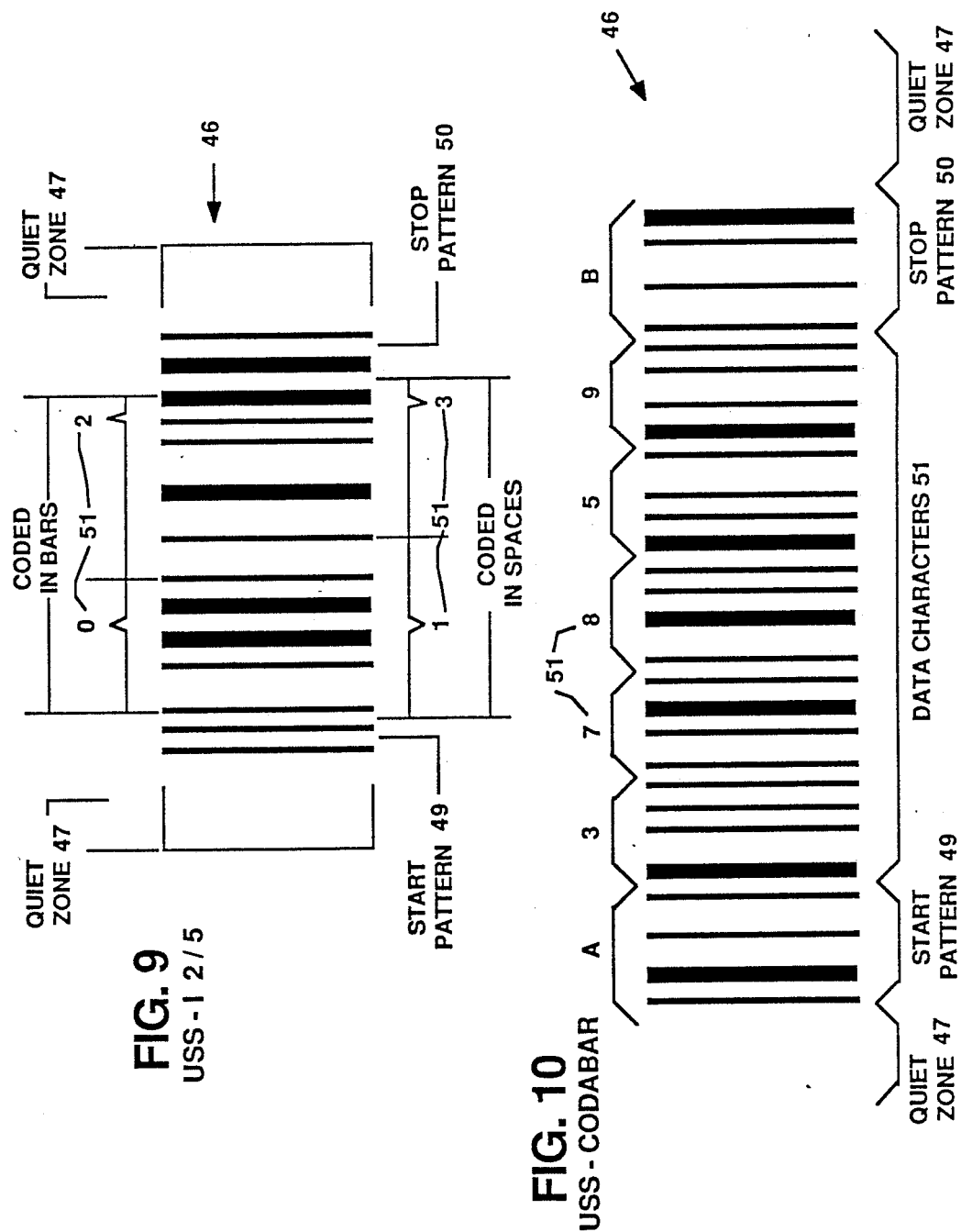
FIGS. 9 to 12 illustrate example bar-code symbols encoded in various bar-code symbologies.
Figure 11:
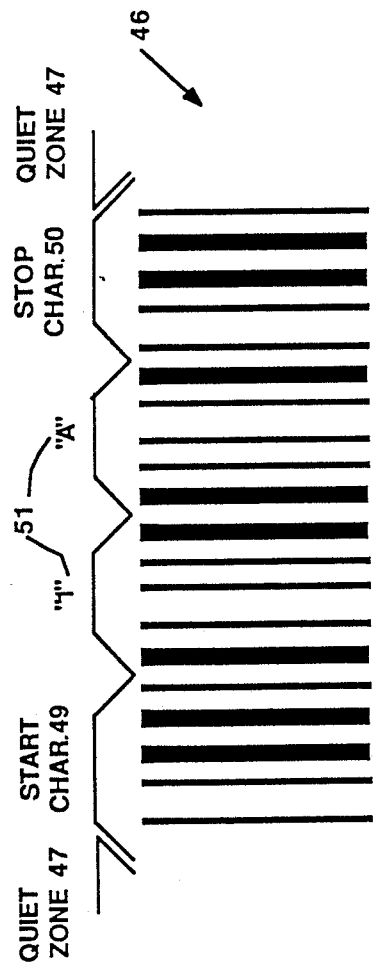
Figure 12:
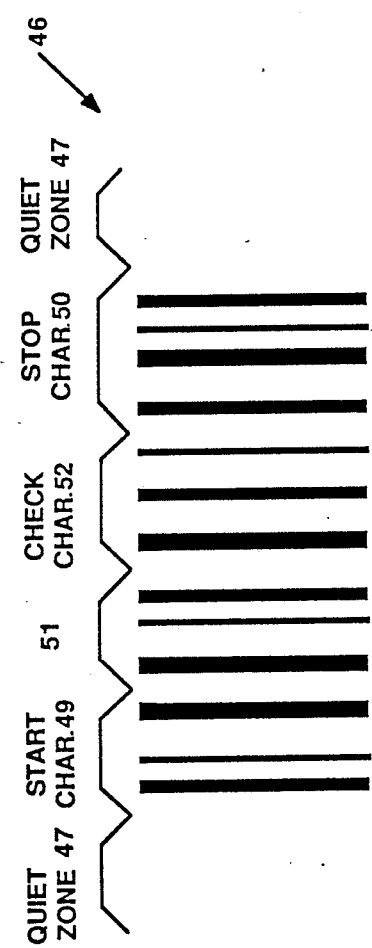

As shown in FIG. 7, the signal produced by the bar-code scanner 38 when it scans a bar-code symbol 36 or 46 is fed to a bar-code decoder 100. If the scanner 38 outputs an analog voltage signal, the decoder 100 uses an analog-to-digital converter 101 to convert this signal to a digital signal 102. (However, some scanners 38 may contain their own analog-to-digital converter and thus provide a signal that is already in digital form.) The decoder 100 then decodes this digital signal 102 into a sequence of numeric or alphanumeric characters, depending on the type of bar-code symbology used to encode the bar-code symbol 36 or 46. The resulting decoded sequence of digits or characters may be displayed on some type of display device 103 (e.g., a LCD display), or transmitted (in serial or parallel form) via some type of communications interface 104 (e.g., RS-232 or IEEE-488) to a computer or other type of data gathering device. The process of scanning a bar-code symbol 36 or 46, and the resulting signals generated by the scanner 38 and decoder 100 are illustrated in FIG. 8.

The bar-code decoder 100 may be implemented using a microprocessor to carry out whatever decoding algorithm is appropriate for the given bar-code symbology in use. Each symbology requires a different decoding algorithm. Reference decoding algorithms for each symbology are specified in the Uniform Symbology Specifications (e.g., USS-Codabar) published by AIM and cited earlier in this specification. A good overview of bar-code decoding algorithms in general is provided in the papers entitled "Decoding", by Tim Harrington of Symbol Technologies, Inc., and "Decoding Information: An Introduction to Scanning and Decoding Information from Bar Codes", by Charles E. Mara of Computer Identics Corporation. Both of these papers are contained in the Proceedings of the Scan-Tech 85 seminar, cited earlier in this specification.

The different decoding algorithms for each symbology may be divided into two classes, corresponding to the two different classes of symbologies described in an earlier section, i.e., "two-width" symbologies and "multiple-width" symbologies. Within each class, the decoding algorithms have a number of basic steps in common.

Further, some of these steps are common to all of the decoding algorithms for both classes of symbologies.

The first step in any bar-code decoding algorithm is to measure the relative widths of all of the bars and spaces in the bar-code symbol being scanned. As the symbol is scanned, more light is reflected from the light spaces than from the dark bars, so the resulting analog signal will rise or fall depending on whether the scanner is sensing a space or a bar. Since the symbol is presumably being scanned at a reasonably steady rate, if the scanner is sensing a space, the length of time the scanner's signal remains high corresponds to the spatial width of that space. Similarly, if the scanner is sensing a bar, the length of time the scanner's signal remains low corresponds to the width of that bar. FIG. 8 illustrates this correspondence between the temporal width of the high and low portions of the scanner's signal and the spatial width of the respective spaces and bars of the symbol being scanned.

To record the width measurements of the bars and spaces, the decoder 100 maintains some type of buffer. The number of entries in this buffer must be at least as large as the maximum number of elements (i.e., bar and spaces, including the leading and trailing quiet zones, which are treated as spaces) contained in the longest bar-code symbol to be decoded by the decoder 100. If the decoder 100 is implemented with a microprocessor, this buffer may be stored in RAM. At the start of each scan, the index for this buffer is reset to address the first element of the buffer. During each scan, on every transition of the digitized version of the scanner's signal (i.e., signal 102), the decoder 100 records in the next entry of the buffer both the length of time the signal 102 was in the previous state, and what that state was (i.e., high or low). At the end of the scan, the buffer index will indicate the number of symbol elements (i.e., bars or spaces) that were sensed; the corresponding entries of the buffer will indicate both the type (i.e., bar or space) and relative width of each of the symbol elements that were sensed.

The absolute magnitude of these "width" measurements (which are in fact really time interval measurements) is a function of the smallest unit of time the decoder 100 can resolve, as well as the speed of the scan and the "X" dimension of the symbols being scanned. This magnitude increases as the X dimension is increased, and decreases as the scan speed is increased. The time resolution of the decoder 100 and the range of time interval values that may be stored in each entry of the buffer must meet the requirements imposed by the X dimension of the bar-code symbols being scanned and the scan speed of the bar-code scanner that scans them.

For example, assume a bar-code scanner is configured to scan a 1 inch long region 100 times per second. The linear speed of the scan is then 100 inches per second, yielding a period of 10 milliseconds per inch. Further, assume this scanner is used to scan bar-code symbols having an X dimension (i.e., width of the narrowest bar or space) of 0.01 inch. In this case, a maximum of 100 symbol elements can be fit into the 1 inch long region being scanned, since the minimum size of any element is 0.01 inch. Accordingly, the decoder's buffer must provide room for at least 100 entries. The time required for the scanner to scan the minimum size (i.e., 0.01 inch wide) symbol element is then 100 microseconds. The time required for the scanner to scan the maximum size symbol element (i.e., a 1 inch wide "space" corresponding to a blank 1 inch wide region) is then 10,000 microseconds. If the time resolution of the decoder is in units of microseconds, then each entry of the decoder's buffer must be capable of storing time interval values ranging from 100 microseconds to 10,000 microseconds; 14 binary bits of storage provides the adequate range. Note that given this time resolution, the decoder can measure the width of the narrowest symbol element to a resolution of 1 part in 100. Also note that as the X dimension is decreased, or the scan speed is increased, the decoder's time resolution may need to be increased.

The second stage in the decoding process occurs at the end of each scan. The decoder checks the buffer index to determine the number of symbol elements that were sensed during the scan. If this number is less than the minimum number of elements contained in any symbol, then a complete symbol was not sensed, and decoding cannot proceed. If an adequate number of elements was sensed, then the decoder searches through the buffer looking for a "quiet zone". The quiet zone is normally required to be at least 10 times the X dimension of the bar-code symbol. In the example given above, the quiet zone would need to be at least 0.1 inch wide, and would produce a time interval measurement of at least 1,000 microseconds. Thus, the decoder would search through its buffer looking for an entry corresponding to a "space" having a "width" of at least 1,000 microseconds. If the decoder cannot locate an entry corresponding to the quiet zone, no further decoding can be performed for this scan.

Once the decoder has located a buffer entry that might correspond to a quiet zone, it must use some type of normalization or classification procedure to convert the raw time interval measurements into a small number of symbol element width classes. In the case of a "two-width" symbology, the number of classes is two (i.e., narrow and wide). Note that for "two-width" symbologies, the ratio between "narrow" and "wide" elements can be in the range from 2.0 to 3.0, but will be constant for any given symbol. Thus, in the example given above, while the "narrow" elements will have time interval measurements of approximately 100 microseconds, the "wide" elements may have measurements in the range of 200 to 300 microseconds. Accordingly, each of the remaining entries in the buffer (up to the last entry measured for this scan) is either classified as "narrow" and assigned a value of 0 if its time interval measurement is close to 100 microseconds, classified as "wide" and assigned a value of 1 if its time interval measurement is close to the range of 200 to 300 microseconds, or classified as a quiet zone if its time interval measurement exceeds 1,000 microseconds.

In the case of a "multiple-width" symbology, the number of classes is usually either three or four. In such symbologies, the widths of the symbol elements are integral multiples of the X dimension of the symbol (i.e., the width of the narrowest element), and the widest element is at most 4 times the width of the narrowest element. Thus, in the example given above, while the narrowest elements will have time interval measurements of approximately 100 microseconds, the widest elements will have measurements close to 400 microseconds, while the remaining sizes of elements will have measurements close to 200 and 300 microseconds, respectively. Accordingly, each of the remaining entries in the buffer (up to the last entry measured for this scan) is classified as either "single-wide", "double-wide", "triple-wide", or "quadruple-wide", and assigned values of 1, 2, 3, or 4 if its time interval measurement is close to 100, 200, 300, or 400 microseconds, respectively. Entries whose time interval measurements exceed 1,000 microseconds are classified as quiet zones.

Once the time interval measurements have been classified (as appropriate for the symbology in use), and the decoder has located a buffer entry that might correspond to a quiet zone, it checks the immediately following "classified" entries in the buffer to see if they correspond to either the start character or the stop character for the given symbology. If they do not, then no further decoding can be performed for this scan. If these entries correspond to the stop character, then the decoder must note the fact that the symbol is being scanned in the reverse direction, and that the remaining sequence of symbol elements will need to be interpreted in reverse order. Also, the decoded data characters will need to be displayed or transmitted i reverse order.

Once the presence of a start character or stop character has been confirmed, the remaining "classified" entries of the buffer (up to the last entry measured and classified for this scan) are compared against a look-up table containing the pattern of symbol elements corresponding to each character in the character set of the symbology in use. If a match cannot be found, further decoding for this scan cannot proceed. Otherwise, for each pattern of symbol elements that matches an entry in the look-up table, the decoded character corresponding to that look-up table entry is added to the decoder's list of decoded characters.

This decoding process proceeds, character by character, until the stop character is detected (or until the start character is detected if the symbol is being scanned in the reverse direction). The next entry in the buffer is then checked to confirm the presence of a trailing quiet zone. Next, any required checksums are computed over the list of decode data characters, and compared with the appropriate decoded check characters. Finally, the total number of decoded characters may be checked against some fixed limit appropriate for the type symbols being scanned. If all of these checks pass, then the symbol that was scanned is considered valid, and the set of characters that the decoder stored on its list of decoded characters is displayed and/or transmitted in the correct order as determined by the direction in which the symbol was scanned. If these checks fail, the symbol is considered invalid, and an error indication may be given.

Most bar-code decoding algorithms follow the basic outline described above. Numerous enhancements and variations are possible. Some algorithms may use a classification procedure that dynamically scales the classification boundaries to adjust for different size symbols and/or varying scan speeds. Other algorithms may decode more than one symbology, and automatically determine the symbology of any symbol scanned. However, these enhancements increase the complexity of the algorithm, and may in some cases decrease the reliability of the decoding operation by increasing the likelihood that marginal or misscanned symbols will be incorrectly decoded as valid.

Such enhancements are not necessary in the encoder of this invention, since the symbols 36 or 46 on the encoder band 30 will all be of the same size and symbology, and the scan speed of the bar-code scanner 38 will remain essentially constant. Because of these constraints, a relatively simple and highly specific algorithm may be used. This may help to improve the decoding reliability and to reduce the computational requirements for implementing the decoding algorithm. These requirements, along with the speed of microprocessor employed to implement the algorithm, will determine the maximum decode rate of the decoder 100. In implementations making use of high scan rate scanners 38 (i.e., above 100 scans per second), the decode rate of the decoder 100 may become the limiting factor. Thus, in determining the overall parameters of the position encoder, the decode rate of the bar-code decoder 100 must be carefully considered, and the scan rate of the scanner 38 selected accordingly.

Some Advantages of the Invention

The system of this invention has several advantages over the more traditional solution of mechanically coupling a rotary encoder to the dome. To start with, mechanical complexity is reduced by eliminating most moving parts, such as pinch rollers, chains, sprockets, and reducing gears. If a moving-beam bar-code scanner is used, the only moving part is the oscillating flat mirror or the rotating polygonal mirror. (However, these parts are in constant motion, even when the dome is stationary, and thus over time will eventually wear out.) If an area-detector or imaging-array bar-code scanner is used, there are no moving parts whatsoever (other than the dome 22 itself).

In addition, even if the dome 22 is out-of-round and/or exhibits vertical warping on its encoder track surface 31, the bar-code scanner 38 can still be rigidly mounted; no added mechanical linkages are required to compensate for these defects, since the large depth-of-focus and pitch-angle tolerances of the moving-beam and area-detector bar-code scanners allow them to scan successfully bar-codes on the encoder track surface even under such circumstances.

Also, since most bar-code symbologies employ check bits or parity bits within each character of the bar-code symbol, and since many also provide checksum or check characters computed over all the characters of the bar-code symbol, the likelihood of a bar-code symbol being misread can be made extremely small. If some of the bar-code symbols 36 or 46 on the encoder band 30 become dirty or otherwise damaged, such errors will usually be detected and reported by the bar-code decoder 100. Selection of an appropriate bar-code symbology can help to maximize such error-detection capabilities.

Finally, since moving-beam and area-detector scanners usually scan a given bar-code symbol many times before it moves outside the scanner's field of view, this increases the chances that a dusty or otherwise marginal bar-code may be read successfully. Also, even when the dome 22 is not moving, the bar-code symbol currently in the scanner's field of view will be read repeatedly, and the bar-code decoder can be configured to re-transmit the decoded position information with each subsequent scan. Such steady stream of position measurements can then be taken as confirmation that the scanner is still functioning, even when the dome is not moving.

The novel application of bar-code technology to position encoders and position measurement A distinctly novel feature of this invention is the use of a sequential series of bar-code symbols 36 or 46, scanned by a bar code scanner 38, to encode and measure position information. Bar codes themselves are certainly not new. One of the earliest patents involving a bar code (in this case a circular bar-code resembling an archery target) is U.S. Pat. No. 2,612,994, filed by Woodland and Silver on Oct. 20, 1949. Although bar codes and bar code scanners have been in use for many years, there appears to be no evidence that they have been used or considered for use in an absolute position encoder or position encoding system.

Bar codes have been used for a tremendous variety of other purposes, the majority of which involve identification of a discrete object. This identification may be in terms of identifying a given object as a member of a class (for example, UPC symbols are used to identify a given container as holding a specific product, such as corn flakes), or in terms of identifying a given object uniquely (as in marking a manufacturer's serial number onto a particular unit.) Bar codes have also been used as a way of quickly selecting a computer command from a menu of commands which have been encoded as bar-code symbols.

Bar-codes are used by an extremely diverse collection of industries and services, including manufacturing, retailing, and shipping. They are also used for inventory control purposes by the U.S. military, and are also used by blood banks for tracking the distribution of donated blood. Libraries make extensive use of bar-codes for checking books in and out. Many organizations (including the U.S. Patent Office) use bar codes for records management (i.e., to keep track of the transfer of files and drawings from one department to another). Cattle ranchers use bar-coded metal tags attached to the ears of cattle to identify individual cows. The variety of such identification applications is too great to enumerate.

However, none of these varied applications of barcodes include or suggest the application described in this specification, namely, the use of a sequential series of bar-code symbols to encode the absolute position of a moving or rotating member, the use of rigidly-mounted moving-beam or area-detector bar-code scanners to scan these bar-code symbols and produce an analog signal voltage, and the use of bar-code decoders to decode this signal into the corresponding absolute position of the moving or rotating member.

Further advantages of the Invention (1) All forms of the invention provide absolute position at regularly spaced intervals.

(2) All forms of the invention provide for bi-directional operation without the use of any externally generated direction information.

(3) All forms of the invention provide for position measurement of objects capable of both discrete and continuous motion in both directions.

(4) All forms of the invention provide for the position measurement of out-of-round and/or vertically warped domes (or other such objects) using a rigidly-mounted scanner without the need for mechanical linkages to compensate for such out-of-roundness or vertical warping.

The combination of these four features distinguish the encoder of this invention from all other existing encoders that I am aware of.

To those skilled in the art to which this invention relates, many changes in construction and widely differing embodiments and applications of the invention will suggest themselves without departing from the spirit and scope of the invention. The disclosures herein are purely illustrative and are not intended to be in any sense limiting.

What is claimed is:

1. An encoding system for determining the absolute position of a movable member relative to a stationary member, including in combination:
   an encoding band supported by one said member comprising a series of bar-code symbols disposed at regular intervals along said band, each said symbol being distinctly different from every other said symbol and each comprising a pattern of bars and spaces for encoding the absolute position corresponding to the location of its symbol along said band,
   reading means rigidly supported by the other said member for scanning said bar-code symbols on said encoding band including means for generating an analog signal voltage,
   said movable member being capable of both discrete and continuous motion in two directions, and
   decoding means actuated by said analog signal voltage for determining the absolute position of said movable member relative to said stationary member,
   whereby said absolute position can be determined solely from said system without dependence on any additional information external to said system.

2. The system of claim 1 wherein said reading means comprises a moving-beam bar-code scanner.

3. The system of claim 1 wherein said reading means comprises an area-detector bar-code scanner.

4. The system of claim 1 wherein said encoding band is cylindrical and is supported perpendicular to the plane of motion of said movable member.

5. The system of claim 1 wherein said band is flat and annular and is supported parallel to the plane of motion of said movable member.

6. The system of claim 1 wherein said bar-code symbols are oriented in the ladder-type format.

7. The system of claim 1 where said bar-code symbols are oriented in the picket fence-type format.

8. An encoding system for determining the absolute position of a rotatable telescope dome relative to a stationary telescope dome building having a cylindrical supporting wall, including in combination:
   an encoding band supported by said rotatable telescope dome comprising a series of bar-code symbols disposed at regular intervals along said band, each said symbol being distinctly different from every other said symbol and each comprising a pattern of bars and spaces for encoding the absolute position corresponding to the location of its symbol along said band,
   reading means rigidly supported by said supporting wall for scanning said bar-code symbols on said encoding band including means for generating an analog signal voltage,
   said rotatable dome being capable of both discrete and continuous motion in two directions, and
   decoding means actuated by said analog signal voltage for determining the absolute position of said rotatable dome relative to said stationary supporting wall,
   whereby said absolute position can be determined solely from said system without dependence on any additional information external to said system.

9. The system of claim 8 wherein said reading means comprises a moving-beam bar-code scanner.

10. The system of claim 8 wherein said reading means comprises an area-detector bar-code scanner.

11. The system of claim 8 where in said encoding band is cylindrical and is supported perpendicular to the plane of motion of said rotatable dome.

12. The system of claim 8 wherein said band is flat and annular and is supported parallel to the plane of motion of said rotatable dome.

13. The system of claim 8 wherein said bar-code symbols are oriented in the ladder-type format.

14. The system of claim 8 where said bar-code symbols are oriented in the picket fence-type format.

* * * * *